(12) United States Patent
Nakamura et al.

(10) Patent No.: US 9,939,267 B2
(45) Date of Patent: Apr. 10, 2018

(54) ANGULAR SPEED DETECTION DEVICE

(71) Applicant: HITACHI AUTOMOTIVE SYSTEMS, LTD., Hitachinaka-shi, Ibaraki (JP)

(72) Inventors: Toshiaki Nakamura, Tokyo (JP); Heewon Jeong, Hitachinaka (JP); Masahide Hayashi, Hitachinaka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 0 days.

(21) Appl. No.: 15/304,640

(22) PCT Filed: Apr. 8, 2015

(86) PCT No.: PCT/JP2015/060908
§ 371 (c)(1),
(2) Date: Oct. 17, 2016

(87) PCT Pub. No.: WO2015/163142
PCT Pub. Date: Oct. 29, 2015

(65) Prior Publication Data
US 2017/0045360 A1    Feb. 16, 2017

(30) Foreign Application Priority Data

Apr. 25, 2014  (JP) ................................. 2014-090827

(51) Int. Cl.
*G01C 19/5726* (2012.01)
*H01L 29/84* (2006.01)

(52) U.S. Cl.
CPC .......... *G01C 19/5726* (2013.01); *H01L 29/84* (2013.01)

(58) Field of Classification Search
CPC ........................... G01C 19/5726; H01L 29/84
(Continued)

(56) References Cited

U.S. PATENT DOCUMENTS 9,464,898 B2 * 10/2016 Hattori et al. ..... G01C 19/5776
2005/0256659 A1   11/2005 Malvern et al.
(Continued)

FOREIGN PATENT DOCUMENTS

JP     2000-105125 A     4/2000
JP     2009-508130 A     2/2009
(Continued)

OTHER PUBLICATIONS

The Extended European Search Report dated Nov. 27, 2017 for the European Application No. 15782583.7.

*Primary Examiner* — Jewel V Dowtin
(74) *Attorney, Agent, or Firm* — Volpe and Koenig, P.C.

(57) ABSTRACT

The purpose of the present invention is to provide an inertial force detection device that can more accurately detect faults in a temperature sensor. Provided is an inertial force detection device configured so that in a state where an oscillating body is made to oscillate in a first direction, the amount of displacement when the oscillating body is displaced in a second direction due to the generation of angular velocity is detected as angular velocity, wherein the inertial force detection device has a means for performing control so that the oscillating body enters a state of resonance in the first direction, a temperature detection means for detecting temperature, and a means for detecting faults in the temperature detection means, and outputs a plurality of signals, which indicate the fault detection results of the three means, continuously from a single signal wire.

5 Claims, 3 Drawing Sheets

(58) Field of Classification Search
USPC .................................................... 73/504.12
See application file for complete search history.

(56) References Cited

U.S. PATENT DOCUMENTS

| | | | |
|---|---|---|---|
| 2006/0016260 A1 | 1/2006 | Smith | |
| 2009/0260435 A1 | 10/2009 | Mayer-Wegelin et al. | |
| 2010/0011834 A1 | 1/2010 | Sato | |
| 2010/0126271 A1* | 5/2010 | Inukai et al. | G01C 19/56 73/504.12 |
| 2011/0238363 A1 | 9/2011 | Nakamura et al. | |

FOREIGN PATENT DOCUMENTS

| | | | |
|---|---|---|---|
| JP | 2010-230491 A | 10/2010 | |
| JP | 2011-203028 A | 10/2011 | |

\* cited by examiner

ANGULAR SPEED DETECTION DEVICE

TECHNICAL FIELD

The present invention relates to an inertial force detecting apparatus for detection inertial force acting at the time of automobile travel.

BACKGROUND ART

An exemplary inertial force detection apparatus is an angular velocity sensor that is used as an anti-skid control device to ensure safety at automobile travel in order to detect angular velocity attributed to skids or turnings on compacted snow roads or frozen roads. In order to enhance angular velocity detection accuracy, a temperature characteristic output by a sensor is corrected, in some cases, by using a temperature sensor. Unfortunately, however, when the temperature sensor has a failure, erroneous correction might be performed at temperature characteristic correction. This erroneous correction would lead to the output of a value from the angular velocity sensor, that is different from the original output value. In order to prevent this, detection of a failure in the temperature sensor is needed, and techniques as described in PTL 1 and 2 are disclosed as methods for detecting a failure in the temperature sensor attached to the angular velocity sensor. PTL 1 describes an exemplary case where a sensor failure is determined by comparing a change amount of resonant frequency from a reference value with a change amount of the temperature sensor output from a reference value. PTL 2 describes an exemplary case where temperature sensors are provided on an angular velocity detection element and on a control unit, and the sensor outputs are compared with each other to determine a temperature sensor failure.

CITATION LIST

Patent Literatures

PTL 1: JP 2009-508130 A
PTL 2: JP 2000-105125 A

SUMMARY OF INVENTION

Technical Problem

Nevertheless, in order to ensure normality of operation of each of these failure detection functions, it would be necessary to provide a function of detecting a failure in the failure detection function itself, in addition to the above-described techniques.

The present invention is intended to provide an inertial force detection apparatus capable of detecting a failure in a temperature sensor with higher accuracy.

Solution to Problem

An inertial force detection apparatus configured to detect a displacement amount when an oscillating body oscillating in a first direction is displaced in a second direction due to generation of angular velocity, as an angular velocity, includes a unit configured to control the oscillating body to be in a resonant state in the first direction, a temperature detection unit configured to detect temperature, and a unit configured to detect a failure in the temperature detection unit. The inertial force detection apparatus sequentially outputs a plurality of signals indicating failure detection results of the three units, from one signal line.

Advantageous Effects of Invention

It is possible to provide an inertial force detection apparatus capable of detecting failures in a temperature sensor with higher accuracy.

DESCRIPTION OF EMBODIMENTS

Hereinafter, exemplary embodiments of the present invention will be described with reference to FIGS. 1 to 7.

Figure 1:
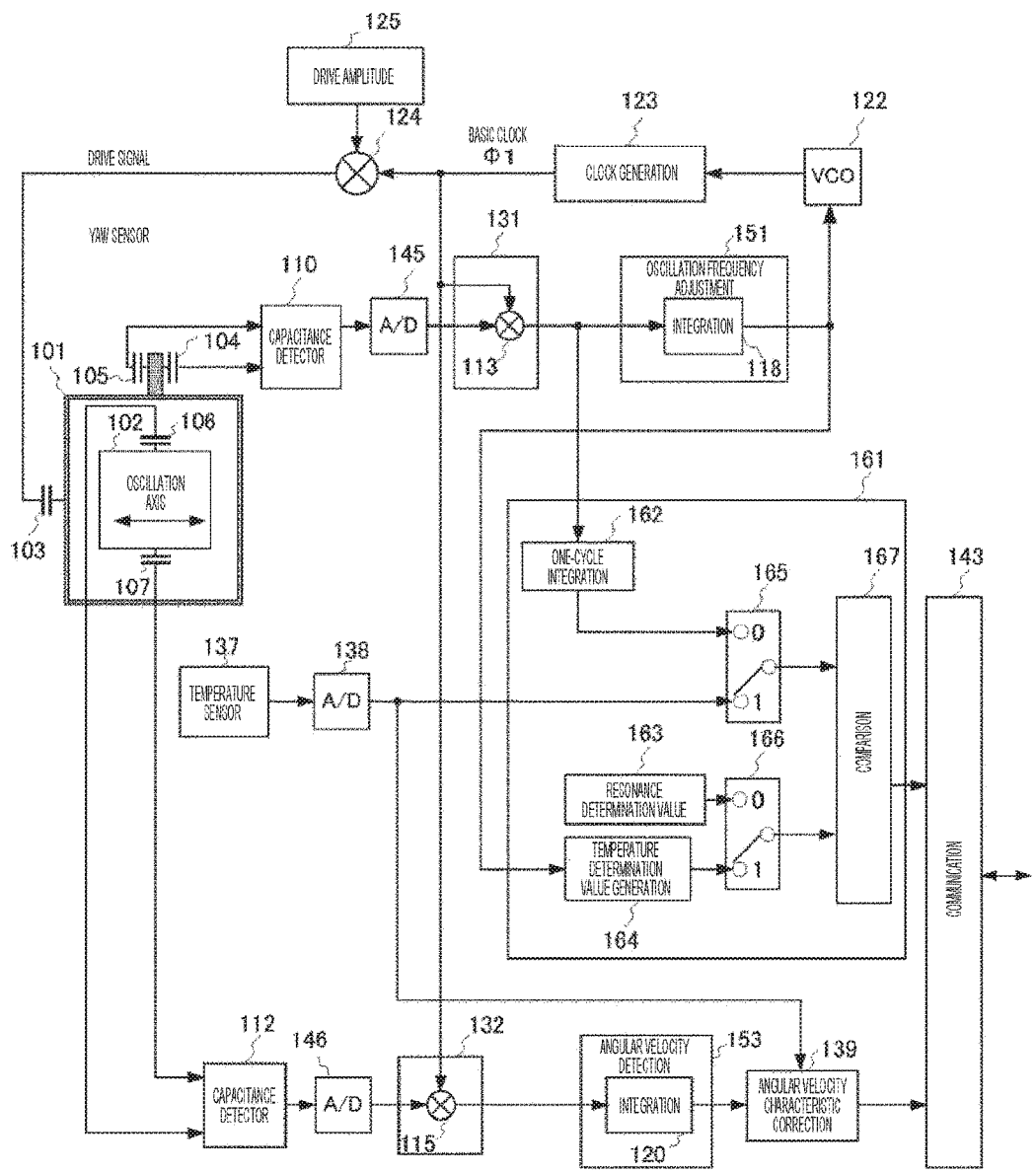
FIG. 1 is a block diagram of a sensor control circuit in an exemplary embodiment.

FIG. 1 is a block diagram of a control circuit of an angular velocity sensor in a first exemplary embodiment. An angular velocity detection element 101 in the present exemplary embodiment includes an oscillator 102, a fixed electrode (external force applying unit) 103, electrodes (displacement detection units) 104 and 105, fixed electrodes (displacement detection units) 106 and 107. The oscillator 102 has a predetermined mass and oscillates with a predetermined oscillation frequency (resonant frequency) fd in an oscillation axis direction. The fixed electrode 103 activates electrostatic force for adjusting oscillation amplitude and oscillation frequency of the oscillator 102 in the oscillation direction. The electrodes 104 and 105 detect oscillation amplitude and oscillation frequency of the oscillator 102 by a change in the capacitance. The fixed electrodes 106 and 107 detect displacement generated in the oscillator 102 in a direction perpendicular to the oscillation axis by the Coriolis force generated by application of angular velocity, by a change in the capacitance.

Also provided are a capacitance detector 110, an AD converter 145, a synchronous detector 131, and an oscillation frequency adjustment unit 151. The capacitance detector 110 detects displacement acting on the detection element 101 in the oscillation axis direction by detecting a difference between the capacitance across the detection element 101 and the fixed electrode 104, and the capacitance across the detection element 101 and the fixed electrode 105. The AD converter 145 converts output of the capacitance detector 110 into a digital signal. The synchronous detector 131 is formed with a multiplier 113 that performs synchronous detection with a detection signal ø1. The oscillation frequency adjustment unit 151 is formed with an integrator 118 that adds output of the synchronous detector 131 for every fixed cycle.

Also provided are a capacitance detector 112, an AD converter 146, a multiplier 115, and an angular velocity detection unit 153. The capacitance detector 112 detects displacement acting on the oscillator 102 by the Coriolis force by detecting a difference between the capacitance across the oscillator 102 and the fixed electrode 106, and the capacitance across the oscillator 102 and the fixed electrode 107, and converts the displacement into a digital signal. The AD converter 146 converts output from the capacitance detector 112 into a digital signal. The multiplier 115 is provided for performing synchronous detection with the detection signal coi. The angular velocity detection unit 153 is formed with an integrator 120 that adds output of the multiplier 115 for every fixed cycle.

Also provided are a voltage controlled oscillator (VCO) 122 and a clock generator 123. The VCO 122 outputs a basic clock of a frequency in accordance with the output of the integrator 118. The clock generator 123 performs frequency-division of the output of the VCO 122 and outputs a drive signal and the detection signal coi.

Also provided is a characteristic correction 139 configured to correct the output of the angular velocity sensor in accordance with the output of the temperature sensor 137.

Also provided is a temperature sensor failure detection unit 161. The temperature sensor failure detection unit 161 includes a half-cycle integration 162, a resonance determination value register 163, a temperature determination value generator 164, a switch 165, a switch 166, and a comparison unit 167. The half-cycle integration 162 performs integration of synchronous detection output for ½ cycle with the synchronous detector 131. The resonance determination value register 163 is provided for detecting, from output of the synchronous detector 131, that the angular velocity detection element 101 is oscillating at the resonant frequency. The temperature determination value generator 164 is provided to detect a failure in the temperature sensor 137. The switch 165 performs changeover between failure detection target signals. The switch 166 performs changeover between failure determination values. The comparison unit 167 determines a failure by comparing the failure detection target signal with the determination value.

The configuration also includes a communication unit 143 configured to output angular velocity detection results from the angular velocity characteristic correction unit 139 and failure detection results from the temperature sensor failure detection unit 161, to an external device.

Figure 2:
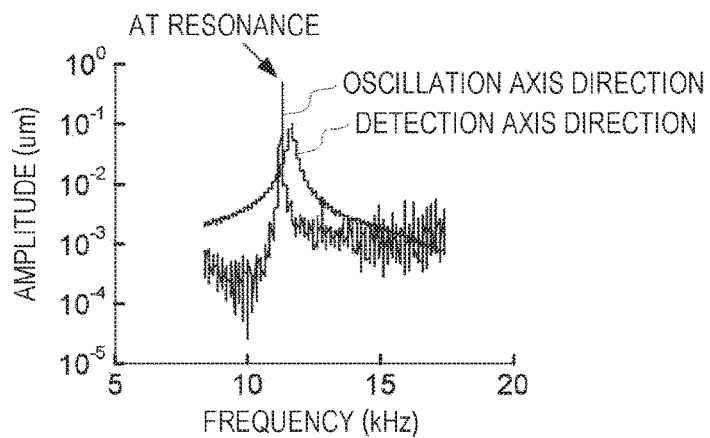
FIG. 2 is a diagram illustrating a frequency-amplitude characteristic in an oscillation axis direction and a detection axis direction.

Next, operation will be described. FIG. 2 illustrates a frequency characteristic of the angular velocity detection element 101 in an oscillation axis direction and a detection axis direction. From FIG. 2, it is understandable that the oscillation amplitude in the oscillation axis direction indicates a steep attenuation characteristic having a resonant frequency at a peak, and that in a case where oscillation occurs at a frequency other than the resonant frequency, the amplitude becomes extremely small, and that, at the same time, the oscillation amplitude in the detection axis direction also attenuates. The frequency of the displacement oscillation in the detection axis direction, caused by generation of the angular velocity, substantially matches the oscillation frequency in the oscillation axis direction. Accordingly, in order to increase the oscillation amplitude in the detection axis direction, it is necessary to constantly drive the oscillation axis direction at the resonant frequency.

For the above-described reasons, the oscillation frequency adjustment unit 151 automatically adjusts the frequency of the drive signal all the time such that the oscillation of the oscillator 102 in the oscillation axis direction is in the resonance state. Displacement of the angular velocity detection element 101 by the drive signal is detected by the fixed electrodes 104 and 105 and is input into the capacitance detector 110. Oscillation displacement in the oscillation axis direction is detected by performing synchronous detection at the synchronous detector 131 onto the oscillator displacement signal obtained via the capacitance detector 110 and the AD converter 145. Next, the signal obtained at the synchronous detector 131 is integrated on the integrator 118.

Figure 3:
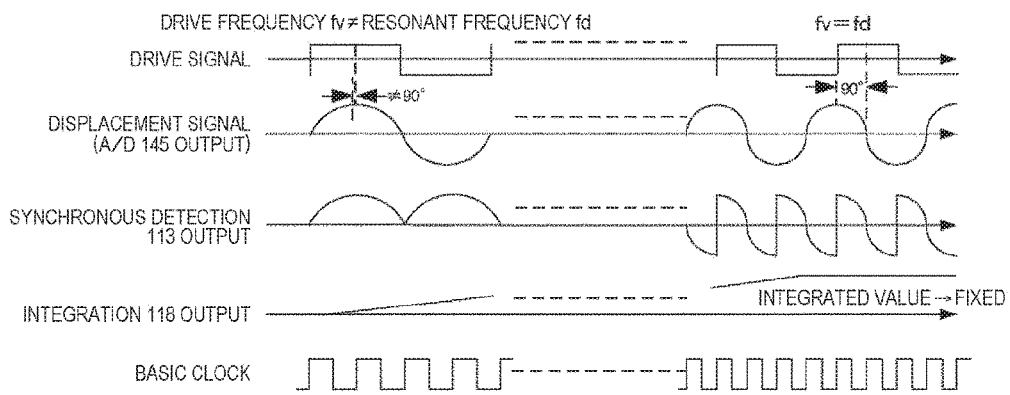
FIG. 3 is a timing chart of an oscillation frequency adjustment unit in an exemplary embodiment.

FIG. 3 illustrates a time chart of the oscillation frequency adjustment unit 151. The drive signal and the displacement signal have a characteristic that their phases are mutually different by 90° when they are in the resonance states, namely, fv (drive signal frequency)=fd (resonant frequency in oscillation axis direction). Accordingly, at synchronous detection performed onto the displacement signal with the detection signal ø1, when the synchronous detection output for one cycle turns out to be zero by canceling out, this indicates the resonance state. At this time, the output from a one-cycle integration 162 is a value that is close to zero. The output of the integrator 118 inside the oscillation frequency adjustment unit 151 is converged to a fixed value. The signal obtained by the integrator 118 is output to the VCO 122. The clock generator 123 generates a drive signal. As illustrated in the time chart in FIG. 3, the basic clock output by the VCO controls such that the frequency is a fixed integral multiple in synchronization with the drive signal all the time.

Next, in order to determine a value set on a drive amplitude register 125 as amplitude, multiplication with the output of the clock generator 123 is performed at the multiplier 124 to generate a drive signal.

Figure 4:
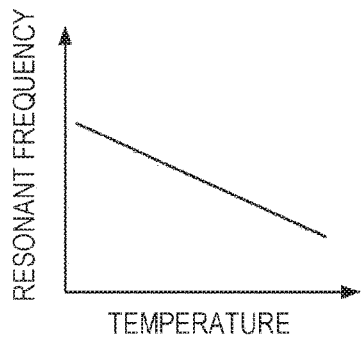
FIG. 4 is a diagram illustrating a resonant frequency-temperature characteristic of an oscillator in a drive direction.
Figure 5:
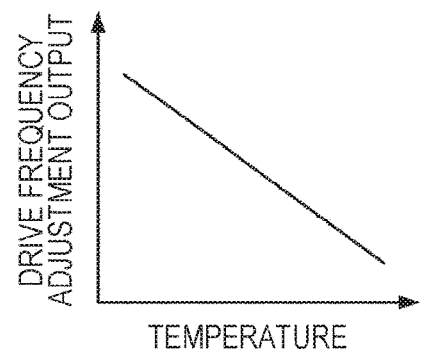
FIG. 5 is a diagram illustrating an output-temperature characteristic of a drive frequency adjustment unit.

FIG. 4 illustrates an exemplary resonant frequency characteristic of the oscillator 101 with respect to the temperature change. As illustrated in FIG. 4, the resonant frequency of the oscillator 101 has a characteristic to be lowered as the temperature increases. Therefore, the oscillation frequency adjustment unit 151 controls such that the drive signal to be supplied to the oscillator 101 is constantly at a resonant frequency, and thus, as illustrated in FIG. 5, the output of the oscillation frequency adjustment unit 151 has a temperature characteristic similar to the one illustrated in FIG. 4.

Figure 6:
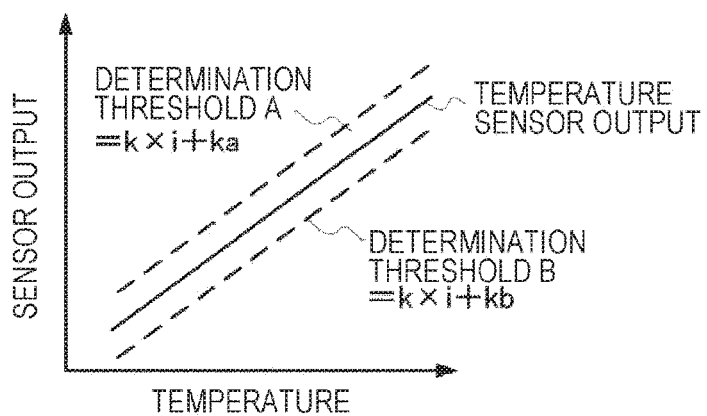
FIG. 6 is a diagram illustrating an output-temperature characteristic of a temperature determination value generator in an exemplary embodiment.

FIG. 6 is a diagram illustrating operation of the temperature determination value generation 164. Since the output of the temperature sensor 137 changes in accordance with the temperature, in a case where failure detection is performed based on the output value, it would be necessary to change a threshold for determination in accordance with the temperature. Determination thresholds A. and B are obtained by an expression illustrated in FIG. 6 using an output value i of the oscillation frequency adjustment unit 151, illustrated in FIG. 5. As one implementation method, it is possible to pre-store coefficients k, ka, and kb in a register and memory and calculate the values by calculation using a multiplier and an adder. When the temperature sensor output is in a range of the determination thresholds A and B, a signal "0" indicating normality is output. When the output is out of range, a signal "1" indicating a failure is output.

Figure 7:
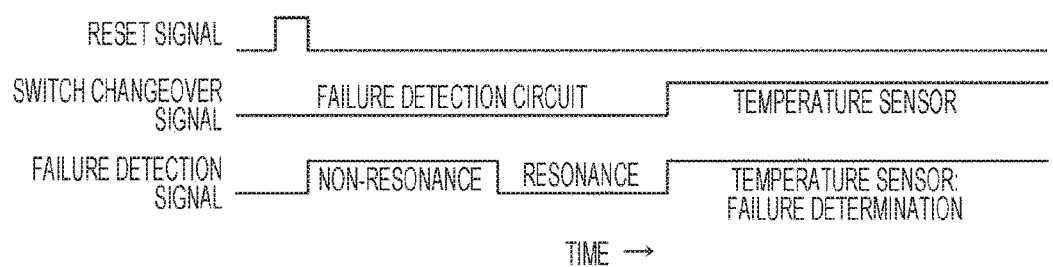
FIG. 7 is a time chart illustrating output of a temperature sensor failure detection unit in an exemplary embodiment.

FIG. 7 is diagram illustrating a time chart of the output signal, for illustrating operation of the temperature sensor failure detection unit 161 of the present invention. After a reset signal is input from an external device, input on the "0" side is selected for each of the switches 165 and 166. After the reset input, "1" indicating non-resonance is output as a failure detection signal during the time until the oscillator 101 is changed from the non-resonance state to the resonance state, for example, for a period of 1 ms. Thereafter, when it is normal, the state is changed to the output of "0"

indicating resonance. Determination whether it is non-resonance or resonance is performed by comparison determination using the output of the one-cycle integrator 162 and the determination threshold stored in the resonance determination value register 163, at the comparison unit 167. As illustrated in the output of the synchronous detection 113 on the timing chart of the oscillation frequency adjustment unit in FIG. 3, when integration is performed, at non-resonance, onto the synchronous detection 113 output by the one-cycle integrator 162 for a drive signal one-cycle period, the result would be a large positive value. In contrast, when it is at resonance, the phases for the drive signal and the displacement signal are mutually shifted by 90°, and thus, the output of the one-cycle integrator 162 is a value extremely close to zero. Accordingly, by storing values close to zero, for example, values ranging from −5 to +5, into the resonance determination value register 163 as resonance determination threshold, it is possible to determine whether the oscillator 1010 is in the resonance state. As a result, it is possible to confirm that a signal indicating resonance of the oscillator 101 is input from the oscillation frequency adjustment unit 151 into the temperature determination value generator 164, and that wiring inside a circuit that forms the comparison unit 165 and the communication unit 143 is not fixed to one of "0" and "1". Thereafter, switch changeover signal is switched to "1" and failure detection results for the temperature sensor are output. Changeover of the switches 165 and 166 can be performed with a method of performing changeover by the communication from an external device, or with a method of automatically performing changeover after a fixed time period after reset signal input has elapsed, that is the time taken for the operation that the oscillator 101 changes from the non-resonance state to the resonance state, or more. As described above, by initially executing detection of a failure in the temperature sensor failure detection unit 161 and confirming whether it is normal, and subsequently executing detection of a failure in the temperature sensor 137, failure detection accuracy of the temperature sensor 137 would be enhanced. As a result, in a case where an output signal line of the temperature sensor failure detection unit 161 is constantly fixed to "0" output due to a failure regardless of the existence of failure in the temperature sensor, by the fact that "1" indicating the non-resonance state of the oscillator 101 has not been output, it is possible to detect, at that point, that failure detection by the temperature sensor is impossible.

REFERENCE SIGNS LIST

101 angular velocity detection element
102 oscillator
103, 104, 105, 106, 107 fixed electrode
110, 112 capacitance detector
113, 115, 124 multiplier
118, 120 integrator
122 voltage control oscillator
123 clock generator
125 drive amplitude register
137 temperature sensor
138, 145, 146 AD converter
139 angular velocity characteristic correction unit
143 communication unit
147 DA converter
151 oscillation frequency adjustment unit
153 angular velocity detection unit
154 servo signal generator
161 temperature sensor failure detection unit
162 one-cycle integrator
163 resonance determination value register
164 temperature determination value generator
165, 166 changeover switch
167 comparison unit

The invention claimed is:

1. An inertial force detection apparatus configured to detect a displacement amount when an oscillating body oscillating in a first direction is displaced in a second direction due to generation of angular velocity, as an angular velocity, the inertial force detection apparatus comprising:
a unit configured to control such that the oscillating body comes into a resonance state in the first direction;
a temperature detection unit configured to detect temperature; and
a unit configured to detect a failure in the temperature detection unit,
wherein a plurality of signals indicating failure detection results of the three units is sequentially output from one signal line.

2. The inertial force detection apparatus according to claim 1,
wherein a failure in the temperature detection unit is detected on the basis of a signal supplied to cause the oscillating body to oscillate in the first direction, a signal attributed to displacement of the oscillating body, generated by the oscillation in the first direction, and a signal output by the temperature detection unit.

3. The inertial force detection apparatus according to claim 1,
wherein the unit configured to detect a failure in the temperature detection unit includes a unit that generates a failure determination threshold that changes in accordance with the temperature, a threshold comparison unit that compares output of the temperature detection unit with the failure determination threshold, determines that the result is normal when the output is in a failure determination threshold range, and determines that the result is a failure when the output is out of the range, and
the signal generated in a unit configured to detect a failure in the unit that generates a failure determination threshold and the signal generated in a unit configured to detect a failure in the threshold comparison unit, are output as a failure detection result of the unit configured to detect a failure in the temperature detection unit.

4. The inertial force detection apparatus according to claim 1,
wherein determination of a change from a non-resonance state to a resonance state, of the oscillating body, is performed before failure detection of the temperature detection unit is performed.

5. The inertial force detection apparatus according to claim 1,
wherein the plurality of sequential signals corresponds to a signal indicating whether the oscillating body is in a resonance state and to a signal indicating a failure detection result of the temperature detection unit.

* * * * *